United States Patent [19]

Christie et al.

[11] Patent Number: 4,955,814

[45] Date of Patent: Sep. 11, 1990

[54] ELECTRICAL CONNECTOR DEVICE

[75] Inventors: Craig Christie, Toronto; Michael Nykoluk, King City, both of Canada

[73] Assignee: Electro Rubber Limited, Toronto, Canada

[21] Appl. No.: 456,961

[22] Filed: Dec. 26, 1989

[51] Int. Cl.$^5$ ............................................. H01R 9/09
[52] U.S. Cl. ..................................... 439/77; 439/449; 439/493
[58] Field of Search ................... 439/76, 77, 328, 329, 439/449, 493, 495, 499, 581, 599

[56] References Cited

U.S. PATENT DOCUMENTS 4,886,942 12/1989 Lenz et al. .......................... 439/449

FOREIGN PATENT DOCUMENTS 150349 4/1973 Japan ................................... 439/493

Primary Examiner—Paula A. Bradley
Attorney, Agent, or Firm—Ridout & Maybee

[57] ABSTRACT

A device for positioning wire conductors relative to a circuit board for electrical connection to it preferably is a plastic molded body having a series of adjacent spaced holes for receiving and holding wires. The holes in the body may be of different sizes to accept various sizes of wire as well as twisted pairs. The bared wire ends extend from the body and are inserted by means of the body through holes drilled in the circuit board for the purpose. Attachment mans, preferably formed in the body, hold the body on the circuit board.

8 Claims, 3 Drawing Sheets

ELECTRICAL CONNECTOR DEVICE

The invention is a device for positioning wire conductors relative to a printed circuit board or the like, so that electrical connections can be made between the wires and the board.

Previously, wires have been individually connected to printed circuit boards, most commonly by manually locating the wire end on the board and soldering it in place. The many drawbacks of this attachment method include errors in attachment of the wires to the board, poor soldering technique which may be difficult to detect by visual inspection, fairly low mechanical strength of the solder connection, and high labor cost.

Wire conductors have also been attached to printed circuit boards by means of male and female connectors. This connection method requires attachment of connector parts to both the wire and the board, and increases the labor and material costs involved in the manufacturing process. Connectors also cause a small voltage drop at their junction points which is undesirable.

The present invention provides a simple device for the attachment of wire conductors to a printed circuit board which overcomes the foregoing disadvantages. The invention is designed to coact with a printed circuit board to position the bared ends of wire conductors in relation to the board so that error free attachment, such as by soldering, can be achieved. The invention enables a visual solder joint inspection, and flux may be readily washed away. No two piece connectors are used in accordance with the invention, thereby saving cost and avoiding the voltage drop and local temperature increase commonly associated with the use of male and female connectors.

The invention ensures that the wires being attached to the circuit board are located in the correct holes without the need for color coding or time consuming wire labelling. The wires are oriented normal to the plane of the board by the device of the invention and mechanically locked in place so that no solder fixtures are required. Because stress is essentially eliminated from individual leads, solder joint failure due to mechanical stress or vibration does not occur. Also, the need to pot wires on the printed circuit board is eliminated.

The device of the invention accepts wires of different diameters and even twisted pairs. By being side by side and end to end stackable on the board, the invention provides a professional appearance to the wire layout and maximizes the printed circuit board area used. By using the prefabricated device of the invention, an electronics manufacturer increases the reliability of the wiring harness incorporating the invention and reduces his labor costs. Thus, wire sorting and the assembly of the device of the invention into a wiring harness becomes a separate manufacturing step. The harness made according to the invention may be pre-tested so that a highly reliable connection to a printed circuit board may be obtained.

These and other advantages are provided by the invention which comprises a body of an electrically insulating material defining a plurality of apertures through it for receiving and holding a plurality of wire conductors so that the bared ends of the wires extend through the body. Means are provided, preferably attached to the body, which coact with the body and a circuit board to attach the body to the board so that the wire conductors are positioned relative to the board for attachment to it.

BRIEF DESCRIPTION OF THE DRAWINGS

A preferred device of the invention is shown in FIG. 1, comprising a body 10 made of an electrically insulating material such as a plastic. Conveniently, the body 10 may be injection molded. The body 10 is provided with a plurality of adjacent apertures 12 which extend transversely through it. Preferably, the apertures each have a first portion 13 of a diameter sufficient to accept an insulated wire 14, and a second portion 15 of a smaller diameter to accept the bared wire end 16. As shown in FIG. 1, preferably the first portions 13 of the apertures 12 are centered along a narrow slot 18 formed along the body 10. This slot 18 does not extend down into the second portions 15 of the apertures 12.

Figure 1:
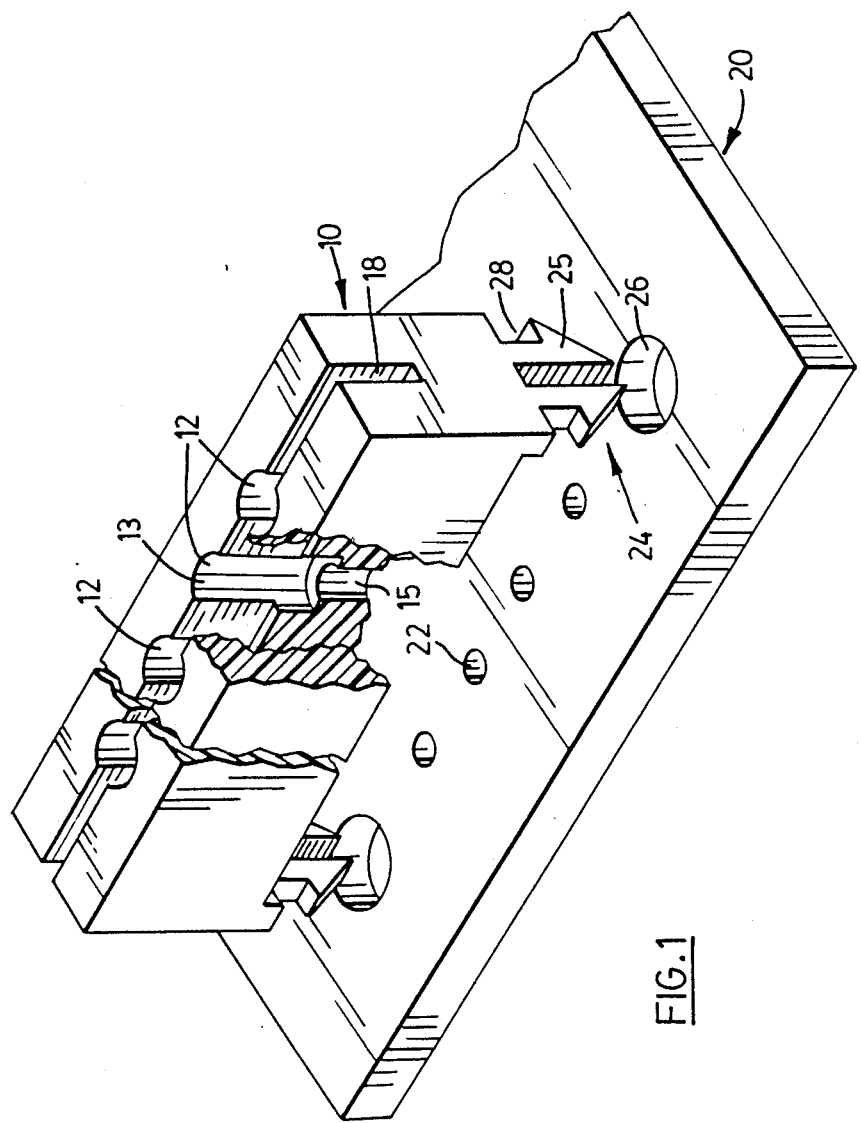
FIG. 1 is a perspective view of a preferred device of the invention.

The apertures 12 may be of varying diameters to accommodate different sizes of wires 14 or even twisted wire pairs (not shown). Pursuant to standard trade practice, the bared wire ends 16 preferably are tinned to facilitate a good solder connection to a printed circuit board. The insulated wire conductors 14 located in the first aperture portions 13 are bonded to the body 10 by ultrasonic welding or chemical binding. Thus, the conductor ends 16 are firmly held in place aligned side by side in the body 10. The longitudinal slot 18 provides the body 10 with some ability to flex to ensure that pressure may be applied to the insulated conductors 14 during the ultrasonic welding operation.

Figure 2:
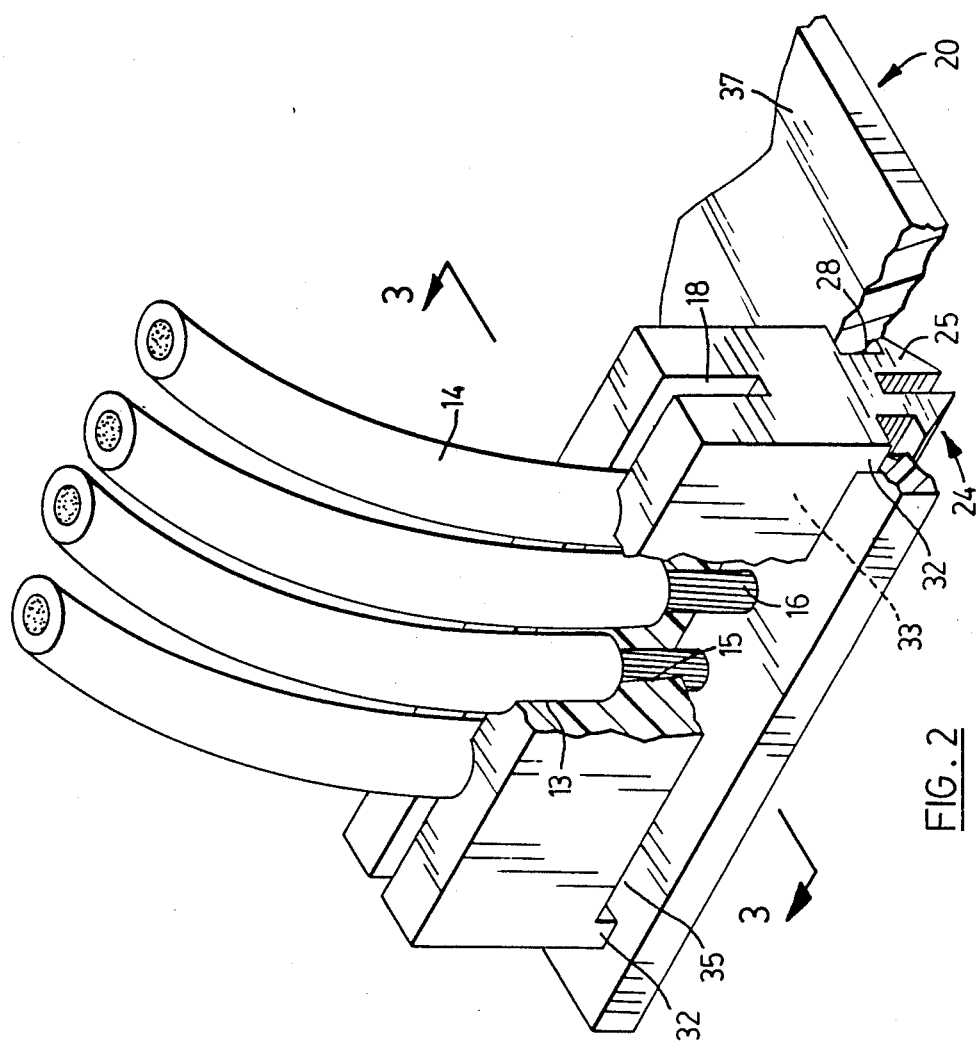
FIG. 2 is a perspective view partially broken away showing the device of the invention installed on a printed circuit board.
Figure 5:
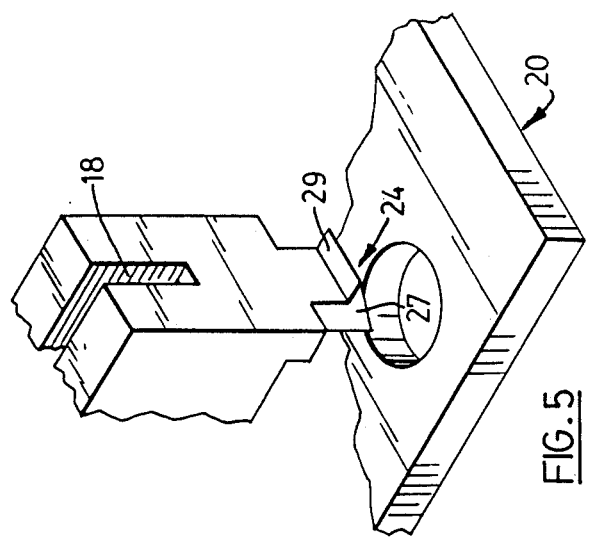
FIG. 5 is a detail perspective view of another variant of attaching means for the invention.
Figure 4:
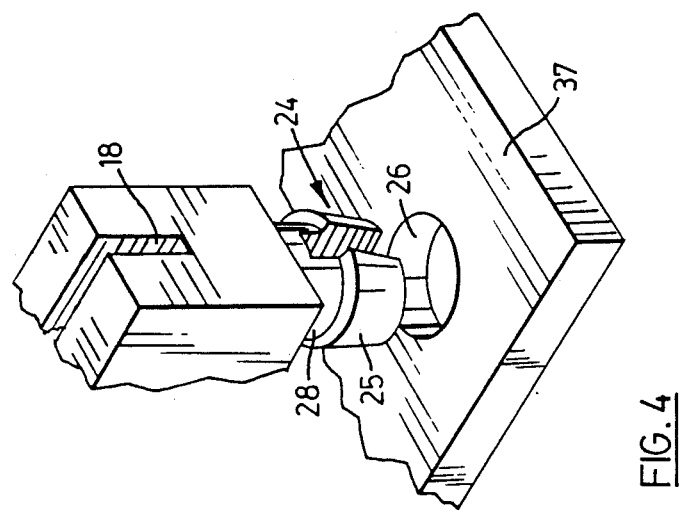
FIG. 4 is a detail perspective view of a variant of attaching means for the invention.
Figure 3:
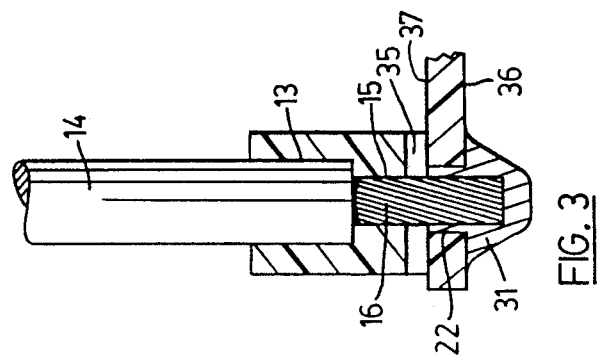
FIG. 3 is a cross sectional view through line 3—3 in FIG. 2.

The purpose of the body 10 is to hold and align a plurality of conductors 14 for attachment to a printed circuit board 20. It should be understood that, as referred to in this specification, the term "printed circuit board" includes any circuit device to which a body 10 of the invention can be attached. The preferred method of attaching the conductor ends 16 extending from the body 10 to a printed circuit board 20 is shown in FIG. 3. Thus, a circuit board 20 is provided with holes 22 through it for receiving the conductor ends 16 extending from the body 10. Means for attaching the body 10 to the board 20 preferably comprise resilient fastening means 24 located at each end of the body 10. The printed circuit board 20 has holes 26 through which the fastening means 24 may be inserted to provide a snap-in engagement of the board 20 in, for example, grooves 28 formed in the means 24 (FIGS. 2 and 4). The fastening means 24 may vary in shape, and examples of suitable means are shown in FIGS. 2, 4 and 5. The resilient fasteners 24 may comprise opposing arms 25 spaced from one another by a sufficient width to allow the arms 25 to bend toward one another when being inserted through a hole 26 in the board 20 (FIGS. 2 and 4). The snap fit of the fasteners 24 is also assisted by tapering each arm 25 toward its outer end. As seen in FIG. 5, the fastening means 24 may comprise an arm 27 having a flange 29 for engaging the board 20 when the arm 27 is snapped in place through the hole 26.

Alternative means for attaching the body 10 to the circuit board 20 will be apparent to the skilled person. Such alternative means include fasteners which are not integral with the body 10, and all such means are within the scope of the invention.

The attachment of the body 10 to the printed circuit board 20 by the attachment means 24 causes the tinned ends 16 of the wires 14 to be positioned through the appropriate holes 22 of the circuit board 20 so that an electrical connection can be made from each wire end 16 to the desired circuit located on the board 20. This electrical connection is typically accomplished through a solder joint 31 formed between the wire end 16 and the circuit path intersecting the hole 22 through which the end 16 extends. The desired connection may be made on either side of the circuit board 20, so the body 10 is preferably formed with circuit board engaging end portions 32 or shoulders 32 which serve to space the circuit board facing side 33 of the body 10 from the board 20. The resulting spacing 35 between the body 10 and the circuit board 20 serves to allow solder to flow through a hole 22 from the bottom side 36 of the board 20 to the top side 37 for the purpose of making a solder connection at the top side 37. The spacing 35 enables visual inspection of the resulting solder joint and allows the flux to be readily washed out.

From the foregoing, the many advantages of the present invention over the prior art will be apparent to the skilled person. These advantages include the ability to attach mixed wire sizes or even twisted wire pairs to a circuit board in a single soldering operation. Wire sorting by the assembler is greatly reduced and connecting errors are essentially eliminated. The structural support provided by the body 10 locked into the circuit board 20 effectively removes mechanical stress on the solder connections formed between the wire ends 16 and the circuits of the board 20.

While a preferred embodiment of the invention has been described above, the invention includes those variants which will be apparent to the skilled person. The foregoing is not intended to restrict the scope of the invention which is set out in the following claims.

We claim:

1. A device for positioning wire conductors relative to a printed circuit board, comprising:
   a body of an electrically insulating material defining a plurality of apertures through it for receiving and holding a plurality of wire conductors so that bared ends of the wires extend through the body, each aperture having a first portion sized to receive an insulated wire conductor and a second portion of a smaller diameter being sized to receive a bared wire end, the body defining a longitudinal slot along which the apertures are centered and the depth of which slot does not extend to the second portions of the apertures; and
   means coacting with the body and circuit board for attaching the body to the board so that the wire ends are positioned relative to the board for attachment to it, the board having holes arranged for receiving the wire ends and attaching means.

2. A device as claimed in claim 1, wherein the body is made of an injection moldable plastic.

3. A device as claimed in claim 1, wherein the body has a plurality of apertures which extend transversely through it with the center of the apertures being in substantial alignment along the length of the body.

4. A device as claimed in claim 1, wherein the apertures are of varying diameter to accommodate different sizes of wire.

5. A device as claimed in claim 1, further comprising spacing means coacting with the body and the circuit board to space the body from the surface of the board when the body is attached to the board.

6. A device as claimed in claim 5, wherein the spacing means are shoulders formed into either end of the body.

7. A device as claimed in claim 1, wherein the body includes means for attaching it to the circuit board, the means comprising a resilient fastener having opposing arms capable of bending toward one another when being inserted through a hole in the circuit board.

8. A device as claimed in claim 7, wherein an arm of the fastener defines a groove for engaging the board when the arm is inserted through said hole in the board.

* * * * *